United States Patent
Datta et al.

(10) Patent No.: US 12,334,880 B2
(45) Date of Patent: Jun. 17, 2025

(54) RECONFIGURABLE POWER AMPLIFIERS WITH CONTROLLABLE INPUT CAPACITANCE

(71) Applicant: Skyworks Solutions, Inc., Irvine, CA (US)

(72) Inventors: Kunal Datta, Sunnyvale, CA (US); Jinghang Feng, San Jose, CA (US); Srivatsan Jayaraman, Santa Clara, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 643 days.

(21) Appl. No.: 17/663,077

(22) Filed: May 12, 2022

(65) Prior Publication Data

US 2022/0376662 A1 Nov. 24, 2022

Related U.S. Application Data

(60) Provisional application No. 63/201,953, filed on May 20, 2021, provisional application No. 63/201,955, filed on May 20, 2021.

(51) Int. Cl.
| | | |
|---|---|---|
| *H03F 9/00* | (2006.01) | |
| *H03F 3/191* | (2006.01) | |
| *H03F 3/195* | (2006.01) | |
| *H03F 3/24* | (2006.01) | |
| *H03F 3/26* | (2006.01) | |
| *H03F 3/30* | (2006.01) | |
| *H04B 1/04* | (2006.01) | |
| *H04B 1/40* | (2015.01) | |

(52) U.S. Cl.
CPC ............. *H03F 3/191* (2013.01); *H03F 3/195* (2013.01); *H03F 3/245* (2013.01); *H03F 3/26* (2013.01); *H03F 3/3083* (2013.01); *H04B 1/0458* (2013.01); *H04B 1/40* (2013.01); *H03F 2200/06* (2013.01); *H03F 2200/09* (2013.01); *H03F 2200/111* (2013.01); *H03F 2200/451* (2013.01)

(58) Field of Classification Search
CPC ................. H03F 9/00; H03F 1/02; H03F 1/07
USPC ..................... 330/276, 124 R, 295
See application file for complete search history.

(56) References Cited

U.S. PATENT DOCUMENTS

| | | |
|---|---|---|
| 5,966,051 A | 10/1999 | Griffith |
| 6,114,911 A | 9/2000 | Iwai et al. |
| 8,072,272 B2 | 12/2011 | Zhao et al. |
| 8,587,377 B2 | 11/2013 | Khesbak et al. |
| 9,054,663 B2 | 6/2015 | Reisner et al. |

(Continued)

*Primary Examiner* — Henry Choe
(74) *Attorney, Agent, or Firm* — Knobbe, Martens, Olson & Bear, LLP

(57) ABSTRACT

Apparatus and methods for reconfigurable power amplifiers are disclosed. In certain embodiments, a mobile device includes a transceiver configured to generate a first radio frequency signal of a first frequency band and a second radio frequency signal of a second frequency band, and a front-end system including a push-pull power amplifier configured to selectively amplify one of the first radio frequency signal or the second radio frequency signal based on a band control signal. The push-pull power amplifier includes an input balun, an output balun, and a pair of amplifiers coupled between the input balun and the output balun. The band control signal is operable to control an input capacitance of the pair of amplifiers.

20 Claims, 14 Drawing Sheets

(56) References Cited

U.S. PATENT DOCUMENTS

| | | |
|---|---|---|
| 9,503,025 B2 | 11/2016 | Cao et al. |
| 9,537,452 B2 | 1/2017 | Samelis |
| 9,712,119 B2 | 7/2017 | Datta et al. |
| 9,787,256 B1 | 10/2017 | Calanca |
| 9,800,207 B2 | 10/2017 | Datta et al. |
| 9,935,593 B2 | 4/2018 | Lyalin |
| 10,038,414 B2 | 7/2018 | Ranta et al. |
| 10,063,200 B2 | 8/2018 | Wu et al. |
| 10,110,183 B2 | 10/2018 | Lyalin et al. |
| 10,135,408 B2 | 11/2018 | Cao et al. |
| 10,263,594 B2 | 4/2019 | Lyalin et al. |
| 10,326,443 B2 | 6/2019 | Ho |
| 10,355,647 B2 | 7/2019 | Datta et al. |
| 10,411,660 B1 * | 9/2019 | Ortiz .................. H03F 3/195 |
| 10,511,272 B2 | 12/2019 | Lyalin |
| 10,581,387 B2 | 3/2020 | Ranta et al. |
| 10,658,991 B2 | 5/2020 | Lyalin et al. |
| 10,778,152 B2 | 9/2020 | Lyalin et al. |
| 11,005,432 B2 | 5/2021 | Ranta et al. |
| 11,031,915 B2 | 6/2021 | Lyalin |
| 11,101,775 B2 | 8/2021 | Datta et al. |
| 11,283,416 B2 | 3/2022 | Cao et al. |
| 11,469,725 B2 | 10/2022 | Cao et al. |
| 2008/0094149 A1 | 4/2008 | Brobston |
| 2011/0095827 A1 | 4/2011 | Tanaka et al. |
| 2016/0118944 A1 | 4/2016 | Data et al. |
| 2019/0245508 A1 | 8/2019 | Lyalin et al. |
| 2021/0083510 A1 | 3/2021 | Liu et al. |
| 2021/0135639 A1 | 5/2021 | Jones et al. |
| 2021/0336588 A1 | 10/2021 | Ranta et al. |
| 2021/0384868 A1 | 12/2021 | Datta et al. |
| 2022/0103139 A1 | 3/2022 | Domino et al. |
| 2022/0131505 A1 | 4/2022 | Snai et al. |
| 2022/0189936 A1 | 6/2022 | Tsutsui et al. |
| 2022/0231640 A1 | 7/2022 | Lyalin |
| 2022/0376733 A1 * | 11/2022 | Datta .................. H03F 3/26 |
| 2023/0024830 A1 * | 1/2023 | Datta .................. H03F 1/0227 |
| 2023/0299729 A1 | 9/2023 | Chen et al. |
| 2023/0327615 A1 | 10/2023 | Chen et al. |

* cited by examiner

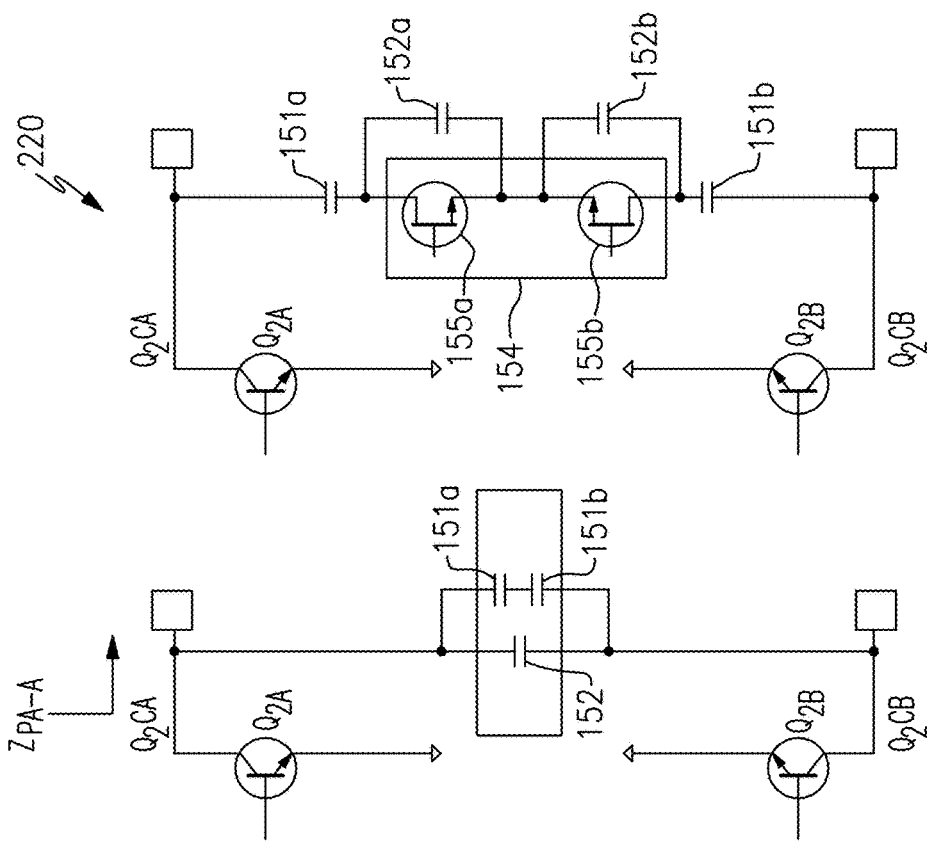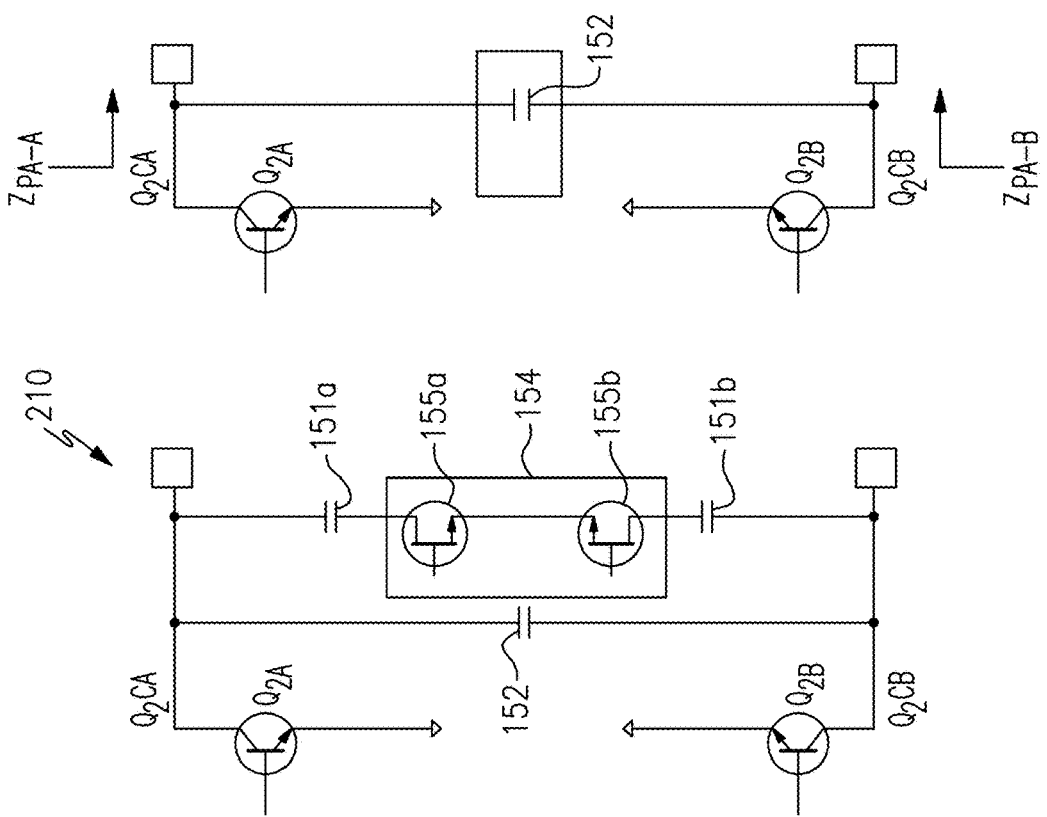

RECONFIGURABLE POWER AMPLIFIERS WITH CONTROLLABLE INPUT CAPACITANCE

CROSS-REFERENCE TO RELATED APPLICATIONS

This application claims the benefit of priority under 35 U.S.C. § 119 of U.S. Provisional Patent Application No. 63/201,953, filed May 20, 2021 and titled "RECONFIGURABLE POWER AMPLIFIERS WITH CONTROLLABLE INPUT CAPACITANCE," and of U.S. Provisional Patent Application No. 63/201,955, filed May 20, 2021 and titled "RECONFIGURABLE POWER AMPLIFIERS WITH CONTROLLABLE OUTPUT CAPACITANCE," each of which is herein incorporated by reference in its entirety.

BACKGROUND

Field

Embodiments of the invention relate to electronic systems, and in particular, to radio frequency electronics.

Description of Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, for instance, in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes a transceiver configured to generate a first radio frequency signal of a first frequency band and a second radio frequency signal of a second frequency band, and a front-end system including a push-pull power amplifier configured to selectively amplify one of the first radio frequency signal or the second radio frequency signal based on a band control signal. The push-pull power amplifier includes an input balun, an output balun, and a pair of amplifiers coupled between the input balun and the output balun. The band control signal is operable to control an input capacitance of the pair of amplifiers.

In various embodiments, the pair of amplifiers includes a first amplifier having a first controllable input capacitor and a second amplifier having a second controllable input capacitor, a capacitance of the first controllable input capacitor and a capacitance of the second controllable input capacitor controlled by the band control signal. According to a number of embodiments, the first controllable input capacitor includes a first fixed input capacitor in parallel with a series combination of a first selectable input capacitor and a first switch. In accordance with a number of embodiments, the first amplifier includes a first bipolar transistor and the input balun includes a primary side and a secondary side, the first controllable input capacitor electrically connected in series between one end of the secondary side of the input balun and a base of the first bipolar transistor.

In several embodiments, the push-pull power amplifier further including a driver amplifier configured to drive a primary side of the input balun, the pair of amplifiers coupled to a secondary side of the input balun. According to a number of embodiments, the band control signal is operable to control the input capacitance of the pair of amplifiers to change an impedance presented to the driver amplifier. In accordance with various embodiments, the push-pull power amplifier further includes a signal selection circuit coupled to an input of the driver amplifier and configured to receive the first radio frequency signal, the second radio frequency signal, and the band control signal.

In some embodiments, the first frequency band is fifth generation N77 and the second frequency band is fifth generation N79.

In various embodiments, the pair of amplifiers each further include an amplification transistor and a controllable ballasting network coupled to an input of the amplification transistor, the controllable ballasting network including at least one of a capacitance or a resistance that changes based on the band control signal.

In several embodiments, the push-pull power amplifier further includes a controllable output capacitor coupled across a pair of outputs of the pair of amplifiers, the controllable output capacitor having a capacitance that changes based on the band control signal.

In certain embodiments, the present disclosure relates to a method of amplification in a mobile device. The method includes generating a first radio frequency signal of a first frequency band and a second radio frequency signal of a second frequency band using a transceiver, selecting one of the first radio frequency signal or the second radio frequency signal as a selected radio frequency signal based on a band control signal, amplifying the selected radio frequency signal using a push-pull power amplifier that includes an input balun, an output balun, and a pair of amplifiers coupled between the input balun and the output balun, and controlling an input capacitance of the pair of amplifiers based on the band control signal.

In various embodiments, the pair of amplifiers each further include an amplification transistor and a controllable ballasting network coupled to an input of the amplification transistor, the method further comprising controlling at least one of a capacitance or a resistance of the controllable ballasting network based on the band control signal.

In several embodiments, the method further includes controlling a capacitance of a controllable output capacitor coupled across a pair of outputs of the pair of amplifiers based on the band control signal.

In certain embodiments, the present disclosure relates to a push-pull power amplifier. The push-pull power amplifier includes an input selection circuit configured to provide a selected radio frequency signal based on a band control signal, the selected radio frequency signal chosen from one of a first radio frequency signal of a first frequency band or a second radio frequency signal of a second frequency band. The push-pull power amplifier further includes an input balun, an output balun, and a pair of amplifiers coupled between the input balun and the output balun and operable to amplify the selected radio frequency signal, the band control signal operable to control an input capacitance of the pair of amplifiers.

In various embodiments, the pair of amplifiers includes a first amplifier having a first controllable input capacitor and a second amplifier having a second controllable input capacitor, a capacitance of the first controllable input capacitor and a capacitance of the second controllable input capacitor controlled by the band control signal.

In some embodiments, the first controllable input capacitor includes a first fixed input capacitor in parallel with a series combination of a first selectable input capacitor and a first switch.

In several embodiments, the first amplifier includes a first bipolar transistor and the input balun includes a primary side and a secondary side, the first controllable input capacitor electrically connected in series between one end of the secondary side of the input balun and a base of the first bipolar transistor.

In various embodiments, the push-pull power amplifier further includes a driver amplifier coupled between the input selection circuit and the input balun, the band control signal operable to control the input capacitance of the pair of amplifiers to change an impedance presented to the driver amplifier.

In some embodiments, the pair of amplifiers each further include an amplification transistor and a controllable ballasting network coupled to an input of the amplification transistor, the controllable ballasting network including at least one of a capacitance or a resistance that changes based on the band control signal.

In various embodiments, the push-pull power amplifier further includes a controllable output capacitor coupled across a pair of outputs of the pair of amplifiers, the controllable output capacitor having a capacitance that changes based on the band control signal.

In certain embodiments, the present disclosure relates to a mobile device. The mobile device includes a transceiver configured to generate a first radio frequency signal of a first frequency band and a second radio frequency signal of a second frequency band, and a front-end system including a push-pull power amplifier configured to selectively amplify one of the first radio frequency signal or the second radio frequency signal based on a band control signal. The push-pull power amplifier includes an input balun, an output balun, a pair of amplifiers coupled between the input balun and the output balun, and a controllable output capacitor coupled across a pair of outputs of the pair of amplifiers and having a capacitance that changes based on the band control signal.

In some embodiments, the pair of amplifiers includes a first amplifier having a first controllable input capacitor and a second amplifier having a second controllable input capacitor, a capacitance of the first controllable input capacitor and a capacitance of the second controllable input capacitor controlled by the band control signal.

In several embodiments, the pair of amplifiers includes a first amplifier including a first bipolar transistor and a second amplifier including a second bipolar transistor, the controllable output capacitor coupled between a collector of the first bipolar transistor and a collector of the second bipolar transistor.

In various embodiments, the controllable output capacitor includes a fixed output capacitor in parallel with a series combination of a first selectable output capacitor, a first switch, a second switch, and a second selectable output capacitor. According to a number of embodiments, the controllable output capacitor further includes a first parallel capacitor in parallel with the first switch and a second parallel capacitor in parallel with the second switch.

In several embodiments, the push-pull power amplifier further includes a driver amplifier configured to drive a primary side of the input balun, the pair of amplifiers coupled to a secondary side of the input balun. According to a number of embodiments, the push-pull power amplifier further includes a signal selection circuit coupled to an input of the driver amplifier and configured to receive the first radio frequency signal, the second radio frequency signal, and the band control signal.

In various embodiments, the first frequency band is fifth generation N77 and the second frequency band is fifth generation N79.

In some embodiments, the pair of amplifiers each further include an amplification transistor and a controllable ballasting network coupled to an input of the amplification transistor, the controllable ballasting network including at least one of a capacitance or a resistance that changes based on the band control signal.

In certain embodiments, the present disclosure relates a method of amplification in a mobile device. The method includes generating a first radio frequency signal of a first frequency band and a second radio frequency signal of a second frequency band using a transceiver, selecting one of the first radio frequency signal or the second radio frequency signal as a selected radio frequency signal based on a band control signal, amplifying the selected radio frequency signal using a push-pull power amplifier that includes an input balun, an output balun, a pair of amplifiers coupled between the input balun and the output balun, and a controllable output capacitor coupled across a pair of outputs of the pair of amplifiers, and controlling a capacitance of the controllable output capacitor based on the band control signal.

In various embodiments, the pair of amplifiers each further include an amplification transistor and a controllable ballasting network coupled to an input of the amplification transistor, the method further including controlling at least one of a capacitance or a resistance of the controllable ballasting network based on the band control signal.

In several embodiments, the method further includes controlling an input capacitance to the pair of amplifiers based on the band control signal.

In certain embodiments, the present disclosure relates to a push-pull power amplifier. The push-pull power amplifier includes an input selection circuit configured to output a selected radio frequency signal based on a band control signal, the selected radio frequency signal chosen from one of a first radio frequency signal of a first frequency band or a second radio frequency signal of a second frequency band. The push-pull power amplifier further includes an input balun, an output balun, a pair of amplifiers coupled between the input balun and the output balun and operable to amplify the selected radio frequency signal, and a controllable output capacitor coupled between a pair of outputs of the pair of amplifiers and having a capacitance that changes based on the band control signal.

In various embodiments, the pair of amplifiers includes a first amplifier having a first controllable input capacitor and a second amplifier having a second controllable input capacitor, a capacitance of the first controllable input capacitor and a capacitance of the second controllable input capacitor controlled by the band control signal.

In some embodiments, the pair of amplifiers includes a first amplifier including a first bipolar transistor and a second amplifier including a second bipolar transistor, the controllable output capacitor coupled between a collector of the first bipolar transistor and a collector of the second bipolar transistor.

In several embodiments, the controllable output capacitor includes a fixed output capacitor in parallel with a series combination of a first selectable output capacitor, a first switch, a second switch, and a second selectable output capacitor. According to a number of embodiments, the controllable output capacitor further includes a first parallel capacitor in parallel with the first switch and a second parallel capacitor in parallel with the second switch.

In some embodiments, the push-pull power amplifier further including a driver amplifier coupled between the input selection circuit and the input balun.

In various embodiments, the first frequency band is fifth generation N77 and the second frequency band is fifth generation N79.

In several embodiments, the pair of amplifiers each further include an amplification transistor and a controllable ballasting network coupled to an input of the amplification transistor, the controllable ballasting network including at least one of a capacitance or a resistance that changes based on the band control signal.

BRIEF DESCRIPTION OF THE DRAWINGS

FIG. 8A is a schematic diagram of one embodiment of a controllable output capacitor.

FIG. 8B is a schematic diagram of the controllable output capacitor of FIG. 8A in a first mode of operation.

FIG. 8C is a schematic diagram of the controllable output capacitor of FIG. 8A in a second mode of operation.

FIG. 8D is a schematic diagram of another embodiment of a controllable output capacitor.

DETAILED DESCRIPTION OF EMBODIMENTS

Figure 1:
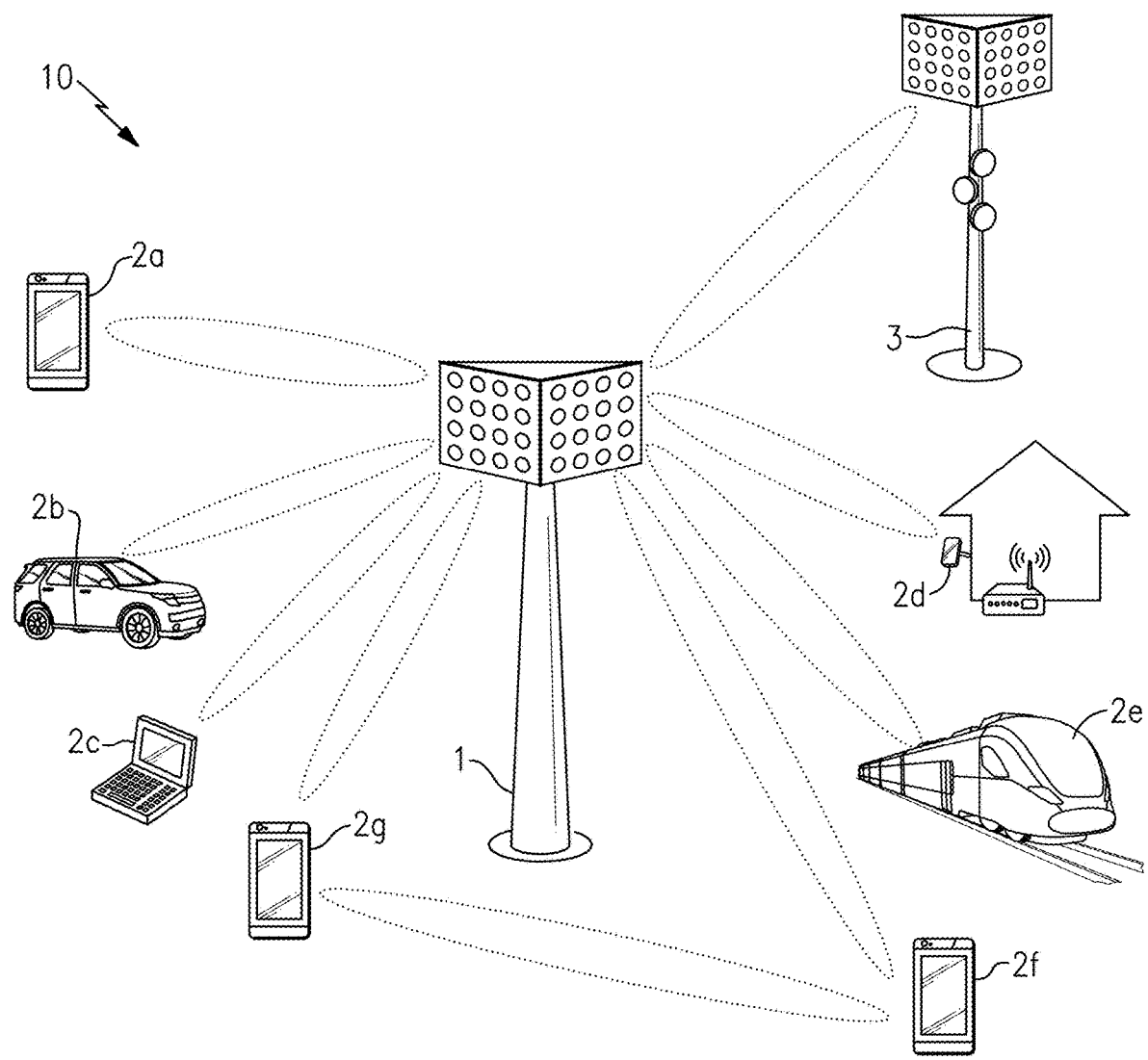
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

In certain implementations, the communication network 10 supports supplementary uplink (SUL) and/or supplementary downlink (SDL). For example, when channel conditions are good, the communication network 10 can direct a particular UE to transmit using an original uplink frequency, while when channel condition is poor (for instance, below a certain criteria) the communication network 10 can direct the UE to transmit using a supplementary uplink frequency that is lower than the original uplink frequency. Since cell coverage increases with lower frequency, communication range and/or signal-to-noise ratio (SNR) can be increased using SUL. Likewise, SDL can be used to transmit using an original downlink frequency when channel conditions are good, and to transmit using a supplementary downlink frequency when channel conditions are poor.

Figure 2A:
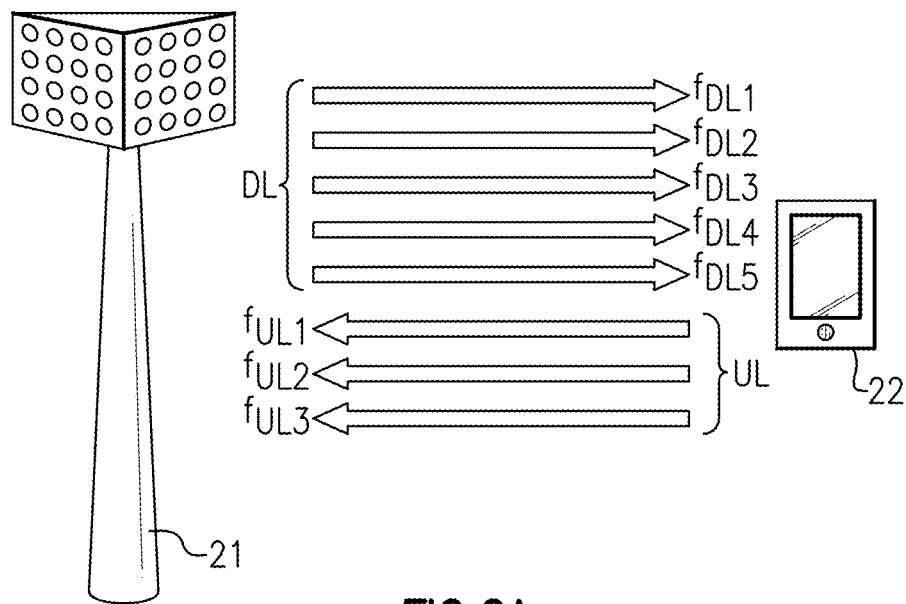
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
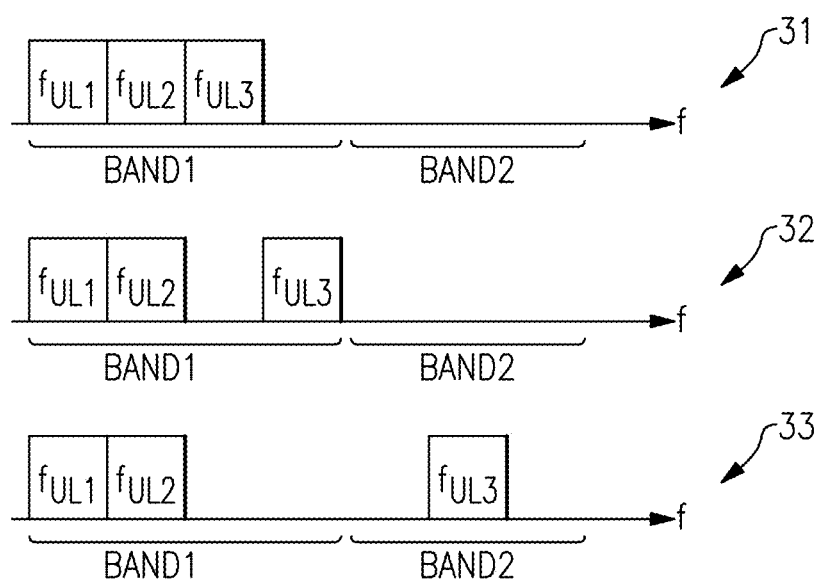
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-contiguous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
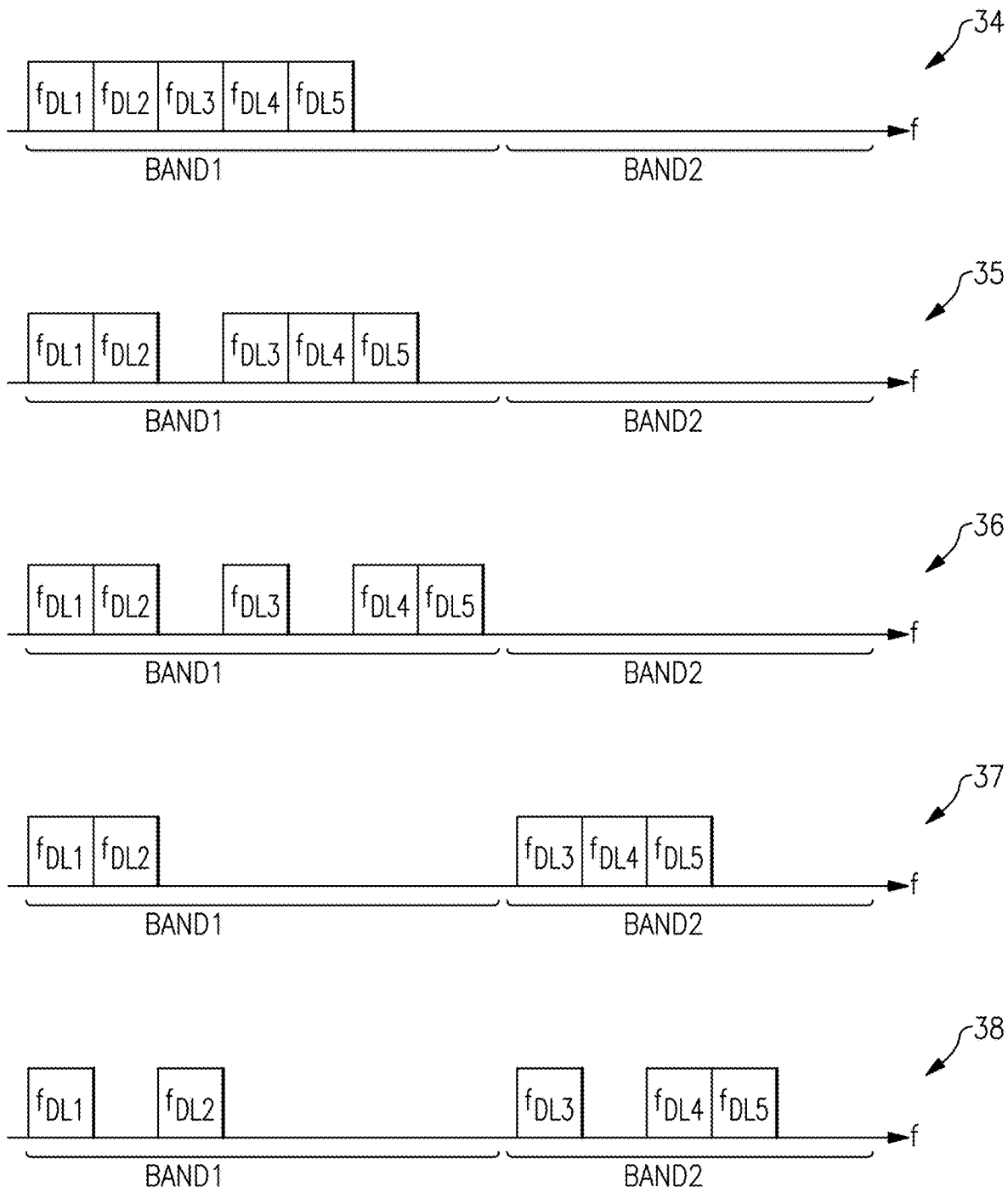
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
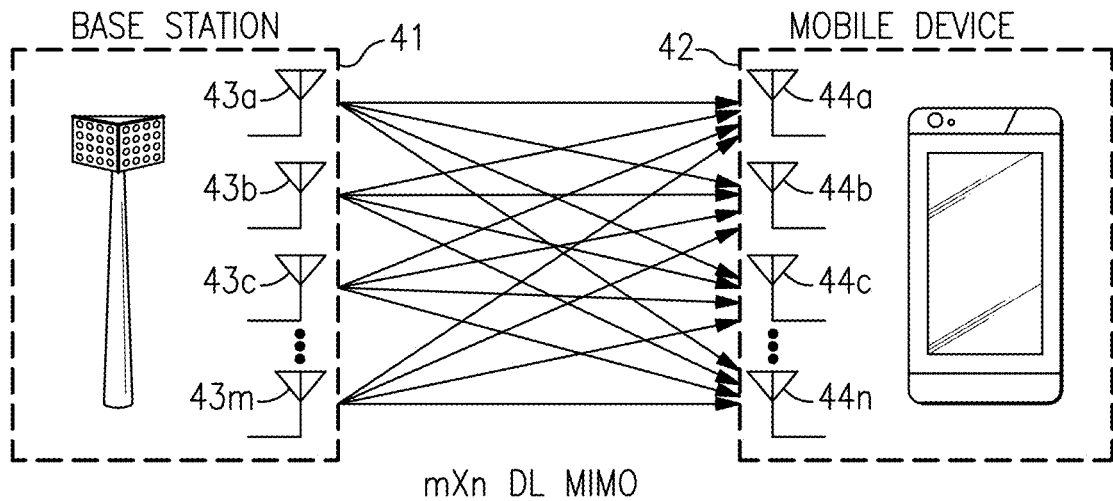
FIG. 3A is a schematic diagram of one example of a downlink channel using multi-input and multi-output (MIMO) communications.
Figure 3B:
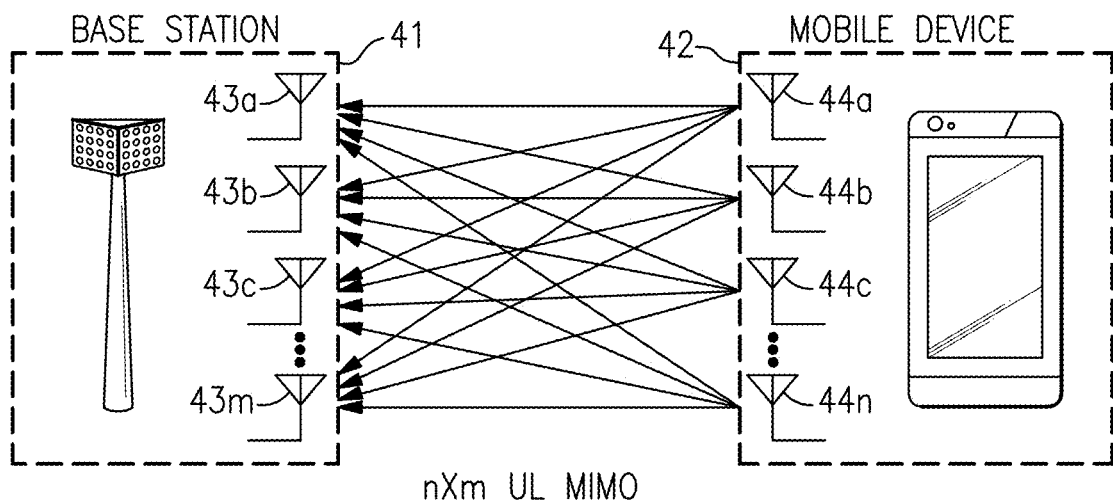
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
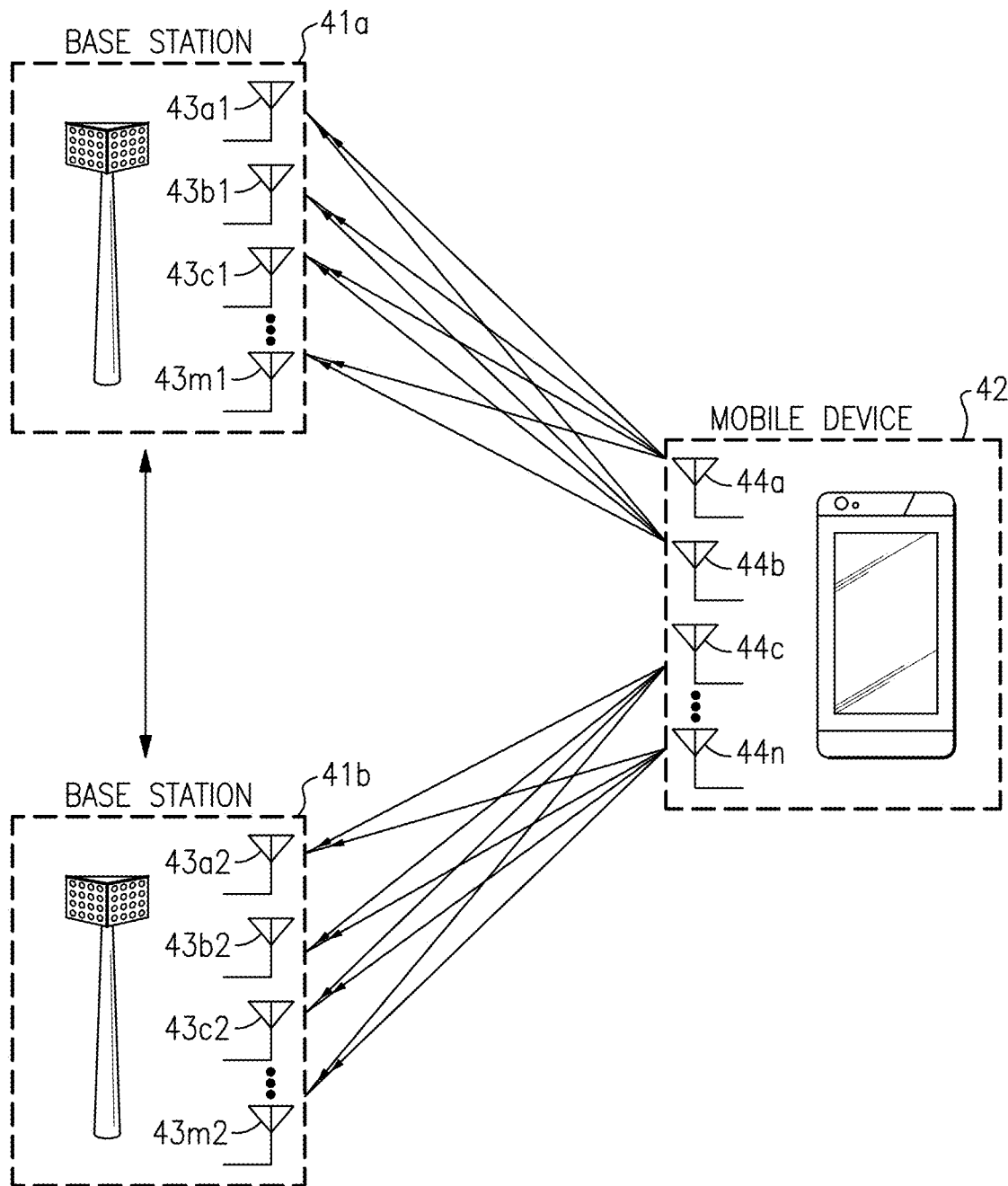
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, . . . 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

With the introduction of the 5G NR air interface standards, 3GPP has allowed for the simultaneous operation of 5G and 4G standards in order to facilitate the transition. This mode can be referred to as Non-Stand-Alone (NSA) operation or E-UTRAN New Radio-Dual Connectivity (EN-DC) and involves both 4G and 5G carriers being simultaneously transmitted from a user equipment (UE).

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

Figure 4:
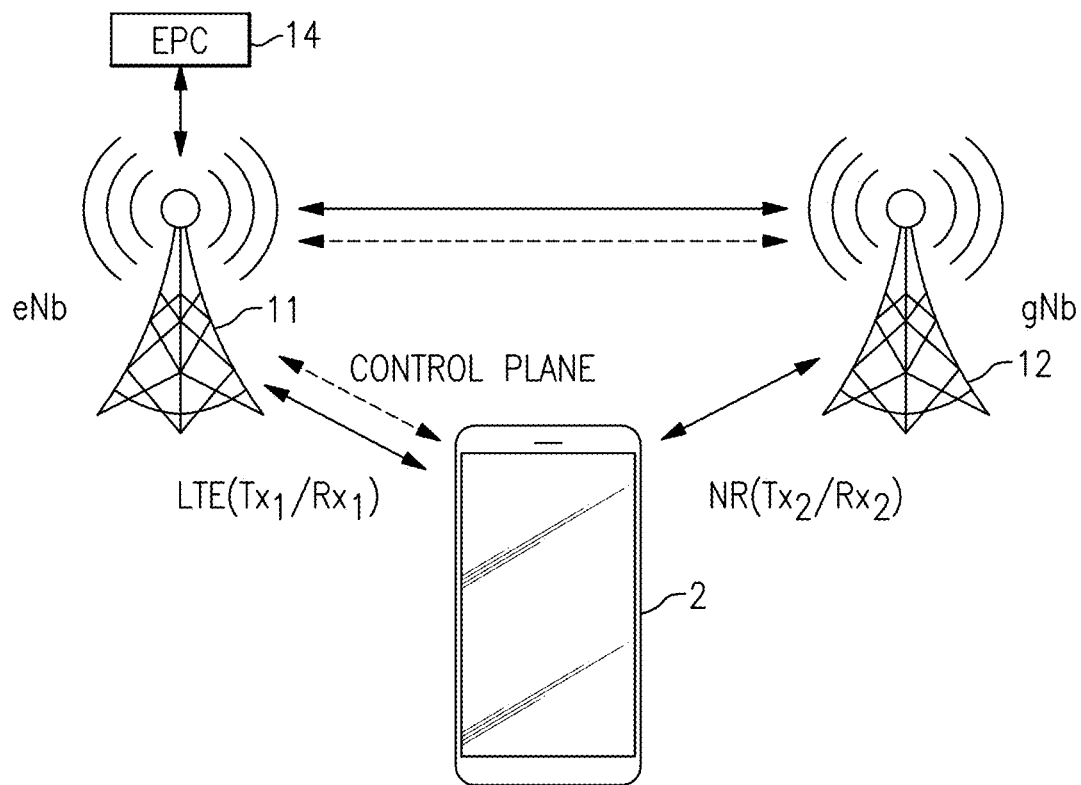
FIG. 4 is a schematic diagram of an example dual connectivity network topology.

FIG. 4 is a schematic diagram of an example dual connectivity network topology. This architecture can leverage LTE legacy coverage to ensure continuity of service delivery and the progressive rollout of 5G cells. A UE 2 can simultaneously transmit dual uplink LTE and NR carrier. The UE 2 can transmit an uplink LTE carrier Tx1 to the eNB 11 while transmitting an uplink NR carrier Tx2 to the gNB 12 to implement dual connectivity. Any suitable combination of uplink carriers Tx1, Tx2 and/or downlink carriers Rx1, Rx2 can be concurrently transmitted via wireless links in the example network topology of FIG. 1. The eNB 11 can provide a connection with a core network, such as an Evolved Packet Core (EPC) 14. The gNB 12 can communicate with the core network via the eNB 11. Control plane data can be wireless communicated between the UE 2 and eNB 11. The eNB 11 can also communicate control plane data with the gNB 12. Control plane data can propagate along the paths of the dashed lines in FIG. 4. The solid lines in FIG. 4 are for data plane paths.

In the example dual connectivity topology of FIG. 4, any suitable combinations of standardized bands and radio access technologies (e.g., FDD, TDD, SUL, SDL) can be wirelessly transmitted and received. This can present technical challenges related to having multiple separate radios and bands functioning in the UE 2. With a TDD LTE anchor point, network operation may be synchronous, in which case the operating modes can be constrained to Tx1/Tx2 and Rx1/Rx2, or asynchronous which can involve Tx1/Tx2, Tx1/Rx2, Rx1/Tx2, Rx1/Rx2. When the LTE anchor is a frequency division duplex (FDD) carrier, the TDD/FDD inter-band operation can involve simultaneous Tx1/Rx1/Tx2 and Tx1/Rx1/Rx2.

As discussed above, EN-DC can involve both 4G and 5G carriers being simultaneously transmitted from a UE. Transmitting both 4G and 5G carriers in a UE, such as a phone, typically involves two power amplifiers (PAs) being active at the same time. Traditionally, having two power amplifiers active simultaneously would involve the placement of one or more additional power amplifiers specifically suited for EN-DC operation. Additional board space and expense is incurred when designing to support such EN-DC/NSA operation.

Examples of Reconfigurable Power Amplifier Architectures for Cellular UE

A radio frequency (RF) communication device can include multiple antennas for supporting wireless communications. Additionally, the RF communication device can include a radio frequency front-end (RFFE) system for processing signals received from and transmitted by the antennas. The RFFE system can provide a number of functions, including, but not limited to, signal filtering, signal partitioning and combining, controlling component connectivity to the antennas, and/or signal amplification.

RFFE systems can be used to handle RF signals of a wide variety of types, including, but not limited to, wireless local area network (WLAN) signals, Bluetooth signals, and/or cellular signals. RFFE systems are also referred to herein as front-end systems.

RFFE systems can be used to process signals of a wide range of frequencies. For example, certain RFFE systems can operate using one or more low bands (for example, RF signal bands having a frequency content of 1 GHz or less, also referred to herein as LB), one or more mid bands (for example, RF signal bands having a frequency content between 1 GHz and 2.3 GHz, also referred to herein as MB), one or more high bands (for example, RF signal bands having a frequency content between 2.3 GHz and 3 GHz, also referred to herein as HB), and one or more ultrahigh bands (for example, RF signal bands having a frequency content between 3 GHz and 7.125 GHz, also referred to herein as UHB). In certain implementations, modules operate over mid band and high band frequencies (MHB).

RFFE systems can be used in a wide variety of RF communication devices, including, but not limited to, smartphones, base stations, laptops, handsets, wearable electronics, and/or tablets.

An RFFE system can be implemented to support a variety of features that enhance bandwidth and/or other performance characteristics of the RF communication device in which the RFFE system is incorporated.

For example, to support wider bandwidth, an increasing number of uplink carrier aggregation scenarios have been developed to support wider bandwidth. Additionally, the bandwidths for uplink and downlink cannot be arbitrarily sent since there is a minimum uplink bandwidth for maintaining a reliable link supported by the transport layer's ACK/NACK traffic. Thus, in 4G/5G, wideband uplink carrier aggregation should be supported to achieve higher bandwidth for downlink carrier aggregation.

Thus, an RFFE system can be implemented to support both uplink and downlink carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Transition from 4G to 5G is through non-standalone (NSA) operation, rather than directly to full standalone (SA) operation. Current networks operate in 4G and 5G concurrently by communicating with an eNodeB and a gNodeB simultaneously in an EN-DC mode of operation. Thus, 4G and 5G transmitters operate concurrently is such a phone.

To provide such feature support, an RFFE system can be implemented to support EN-DC.

Support for EN-DC can cover a wide range of frequency bands, including using a 4G band in the LB, MHB, HB, or UHB frequency ranges in combination with a 5G band in the LB, MHB, HB, or UHB frequency ranges. Thus, various combinations of EN-DC including, but not limited to, LB-LB EN-DC, MHB-MHB EN-DC, LB-MHB EN-DC, LB-UHB EN-DC, MHB-UHB EN-DC, and UHB-UHB EN-DC, are possible.

Moreover, in certain dual uplink transmission scenarios, it can be desirable to provide flexibility between swapping which antenna transmits a first RF transmit signal (for instance, one of a 4G signal or a 5G signal) on a first side of a phone board assembly and which antenna transmits a second RF transmit signal (for instance, the other of the 4G signal or the 5G signal) on a side of the phone board assembly. To provide such flexibility, an RFFE system can support a transmit swap function (antenna swap) to selectively switch which antenna a particular RF transmit signal is transmitted from.

Another technique for increasing uplink capacity is uplink multiple-input multiple-output (MIMO) communications, in which multiple (for instance, two) power amplifiers transmit two different signals simultaneously on the same frequency using different antennas. MIMO communications benefit from higher signal to noise ratio, improved coding, and/or reduced signal interference due to spatial multiplexing differences of the radio environment. MIMO order refers to a number of separate data streams sent or received.

Figure 5:
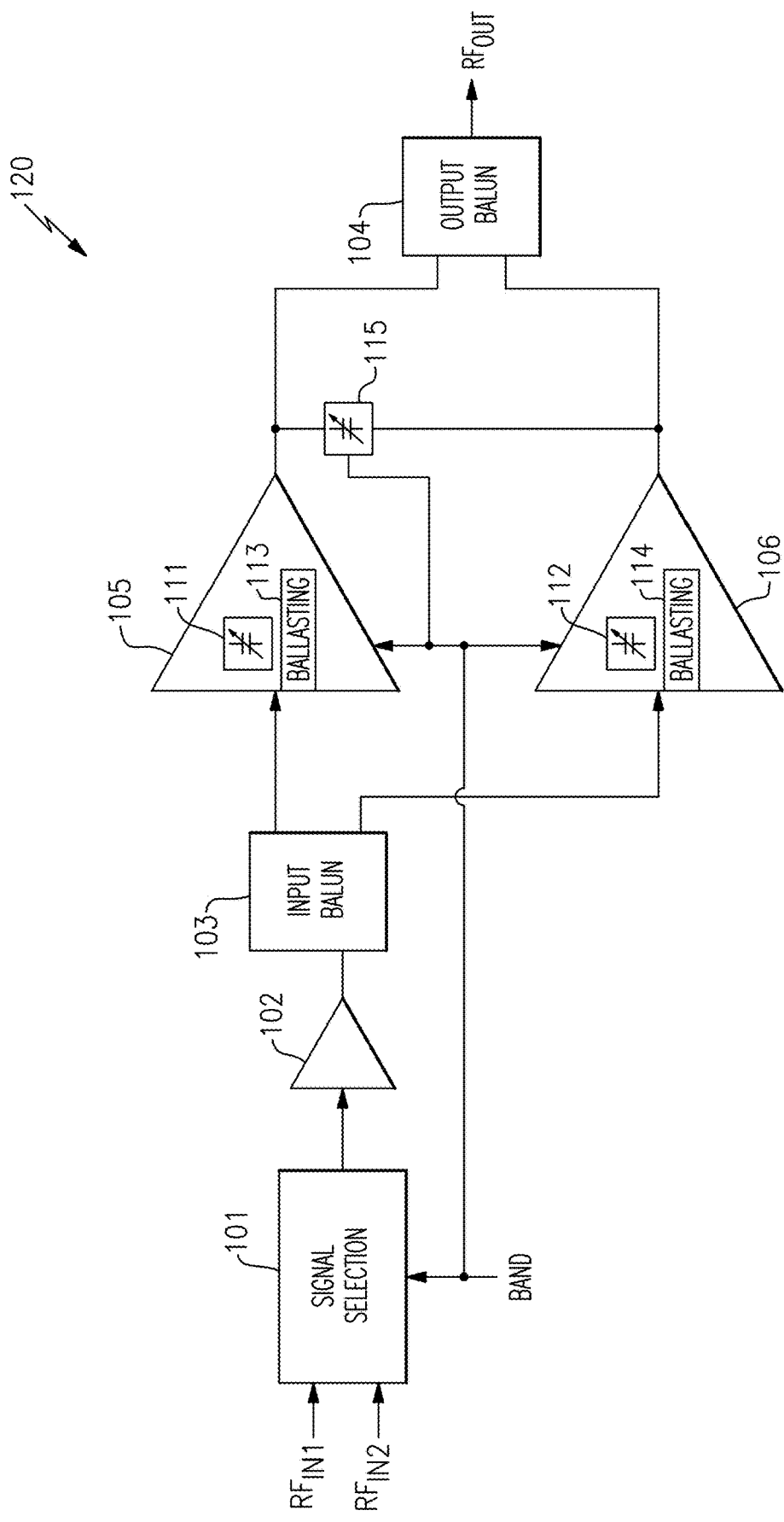
FIG. 5 is a schematic diagram of a reconfigurable power amplifier according to one embodiment.

FIG. 5 is a schematic diagram of a reconfigurable power amplifier 120 according to one embodiment. The reconfigurable power amplifier 120 includes a signal selection circuit 101, a driver amplifier 102, an input balun 103, an output balun 104, a first output amplifier 105, a second output amplifier 106 (the first output amplifier 105 and the second output amplifier 106 are collectively referred to as a pair of output amplifiers), and a controllable output capacitor 115. The first output amplifier 105 includes a first controllable input capacitor 111 and a first controllable ballasting network 113. Additionally, the second output amplifier 106 includes a second controllable input amplifier 112 and a second controllable ballasting network 114.

As shown in FIG. 5, the signal selection circuit 101 receives a first RF input signal $RF_{IN1}$ of a first frequency band, a second RF input signal $RF_{IN2}$ of a second frequency band, and a band control signal BAND for controlling operation of the reconfigurable power amplifier 120 in the first frequency band or the second frequency band.

Although the illustrated embodiment depicts a reconfigurable power amplifier that operates over two frequency bands, the teachings herein are also applicable to reconfigurable power amplifiers operating over three or more frequency bands.

The band control signal BAND is used for selecting the first RF input signal $RF_{IN1}$ or the second RF input signal $RF_{IN2}$ for amplification by the reconfigurable power amplifier 120. The band control signal BAND is also used to control the controllable output capacitor 115, thus choosing an output capacitance suitable for the chosen frequency band. Additionally or alternatively, the band control signal BAND is used to control an input capacitance of the first output amplifier 105 and the second output amplifier 106, thereby setting the input capacitance to a suitable value for the chosen frequency band.

The ballasting network of each output amplifier is also controlled by the band control signal BAND, in this embodiment. However, the teachings herein are also applicable to configurations in which ballasting networks are not controlled by a band control signal.

The first frequency band and the second frequency band can correspond to any two suitable frequency bands. In one example, first frequency band and the second frequency band are each a 5G band, such as N77 and N79. However, other implementations are possible, including, but not limited to, two different 4G bands (for instance, a mid band MB and a high band HB) or a 4G band and a 5G band.

Accordingly, the reconfigurable power amplifier 120 utilizes multiple configurability techniques to enable a single push-pull differential power amplifier to operate over multiple frequency bands. Thus, wide bandwidth operation is achieved, for instance, close to 50% fractional bandwidth. Such techniques can enable a single power amplifier to cover, for instance, the entire 5G NR FR1 bands from 3.3 GHz-4.2 GHz (N77 transmit band) and from 4.4 GHz to 5.0 GHz (N79 transmit band) using a single power amplifier and load-line.

The reconfigurable power amplifier 120 can achieve good output power, high power added efficiency (PAE), and/or linear power operation over both frequency bands. By using the same power amplifier for both frequency bands, reduced die cost, fewer surface mount components, and/or smaller module area can be achieved.

In certain embodiments, the reconfigurable power amplifier 120 is operable in a high frequency mode and a low frequency mode. Additionally, each of the controllable components have component values selected to achieve robust performance for each of the frequency modes.

In one example, the controllable output capacitor 115 is used to ensure wideband operation and harmonic termination (for instance, third-order harmonic termination) at the output of the first output amplifier 105 and the output of the second output amplifier 106. Thus, the controllable output capacitor 115 can have a first output capacitance value in the low frequency mode and a second output capacitance value in the high frequency mode.

In another example, the first controllable input capacitor 111 and the second controllable input capacitor 112 each provide a first input capacitance value in the low frequency mode and a second input capacitance value in the high frequency mode. Such switchable input capacitance can be used to ensure wideband operation of the input balun 103, which can be integrated on-chip with the first output amplifier 105 and the second output amplifier 106 in certain implementations.

In yet another example, the first ballasting network 113 and the second ballasting network 114 each provide a first resistance value and a first capacitance value in the low frequency mode, and a second resistance value and a second capacitance value in the high frequency mode. Such switchable resistor-capacitor (RC) ballasting can provide desired compensation for amplitude distortion (AM/AM) and/or phase distortion (AM/PM). For instance, such RC ballasting can provide desired AM/AM and/or AM/PM expansion for a given frequency mode.

Figure 6:
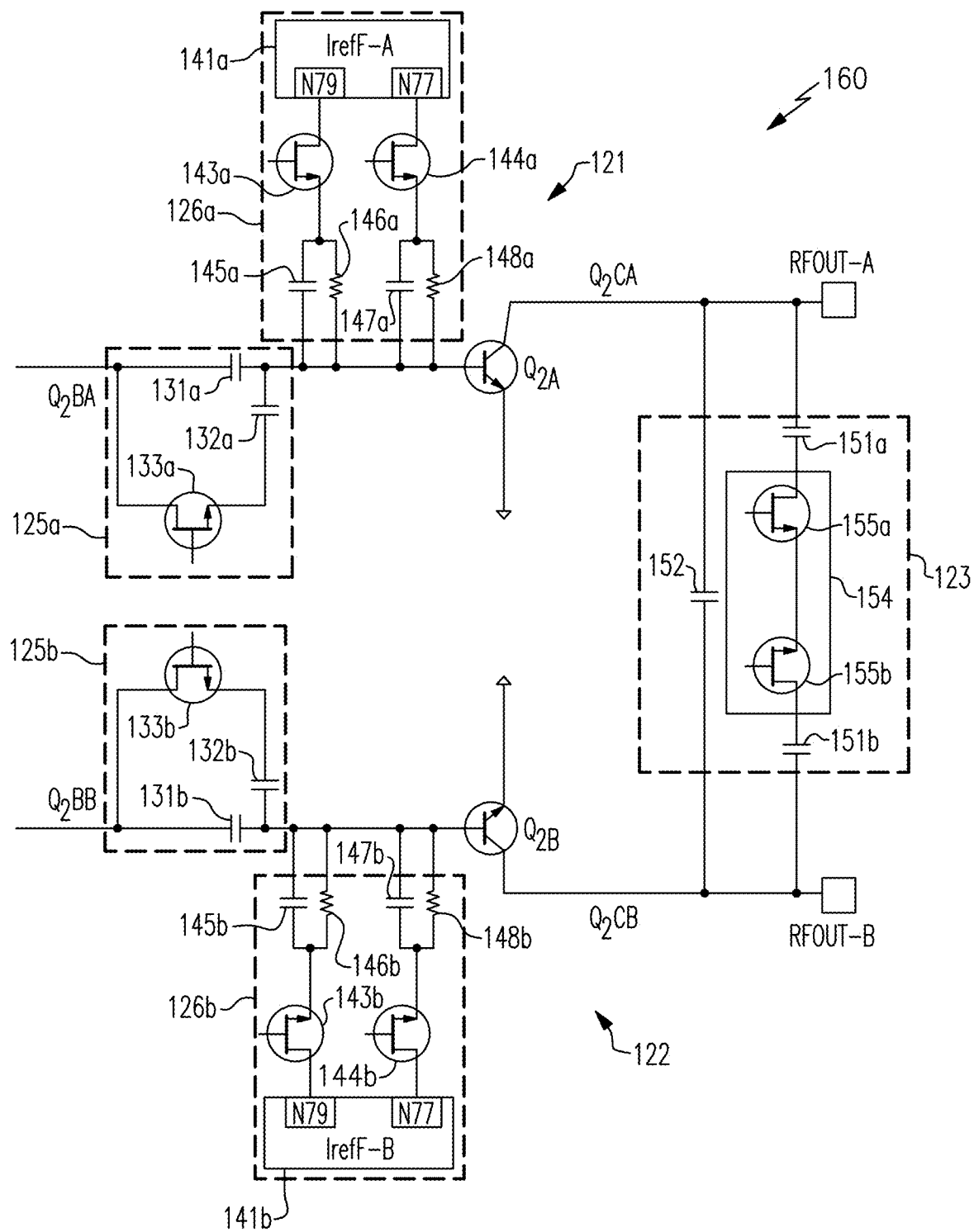
FIG. 6 is a schematic diagram of a portion of a reconfigurable power amplifier according to another embodiment.

FIG. 6 is a schematic diagram of a portion of a reconfigurable power amplifier according to another embodiment. The reconfigurable power amplifier circuitry 160 of FIG. 6 includes a first output amplifier 121, a second output amplifier 122, and a controllable output capacitor 123. The reconfigurable power amplifier circuitry 160 implements a portion of a reconfigurable push-pull amplifier in accordance with one embodiment.

As shown in FIG. 6, the first output amplifier 121 includes a controllable input capacitor 125a, a controllable ballasting network 126a, and a common emitter bipolar transistor $Q_{2A}$. The first output amplifier 121 includes an input coupled to a node $Q_2BA$ and an output coupled to a node RFOUT-A. The controllable input capacitor 125a includes a fixed base capacitor 131a, a selectable base capacitor 132a, and a selection switch 133a. Additionally, the controllable ballasting network 126a includes a bias current circuit 141a, a first selection switch 143a, a second selection switch 144a, a first ballasting capacitor 145a, a first ballasting resistor 146a, a second ballasting capacitor 147a, and a second ballasting resistor 148a.

With continuing reference to FIG. 6, the second output amplifier 122 includes a controllable input capacitor 125b, a controllable ballasting network 126b, and a common base bipolar transistor $Q_{2B}$. The second output amplifier 122 includes an input coupled to a node $Q_2BB$ and an output coupled to a node RFOUT-B. The controllable input capacitor 125b includes a fixed base capacitor 131b, a selectable base capacitor 132b, and a selection switch 133b. Additionally, the controllable ballasting network 126b includes a bias current circuit 141b, a first selection switch 143b, a second selection switch 144b, a first ballasting capacitor 145b, a first ballasting resistor 146b, a second ballasting capacitor 147b, and a second ballasting resistor 148b.

In the illustrated embodiment, the selectable output capacitor 123 includes a first selectable capacitor 151a, a second selectable capacitor 151b, a fixed capacitor 152, and a selection structure 154 including a series combination of a first selection switch 155a and a second selection switch 155b.

The reconfigurable power amplifier circuitry 160 of FIG. 6 illustrates one embodiment of a reconfigurable push-pull amplifier in accordance with the teachings herein. In the illustrated embodiment, the reconfigurable power amplifier circuitry 160 includes amplifier input capacitance, amplifier output capacitance, and amplifier ballasting that changes based on whether the reconfigurable power amplifier circuitry 160 is amplifying a first RF signal of a first frequency band (for instance, N77) or a second RF signal of a second frequency band (for instance, N79).

For example, based on operating frequency, the selection switches 133a and 133b can be opened for higher base input capacitance or closed for lower base input capacitance. Additionally, based on operating frequency, the selection structure 154 can be opened for lower output capacitance or closed for higher output capacitance. Furthermore, based on operating frequency, one of two RC ballasting networks can be selected for each of the output amplifiers. Thus, each of the depicted selection switches can be controlled based on a state of a band control signal.

Figure 7:
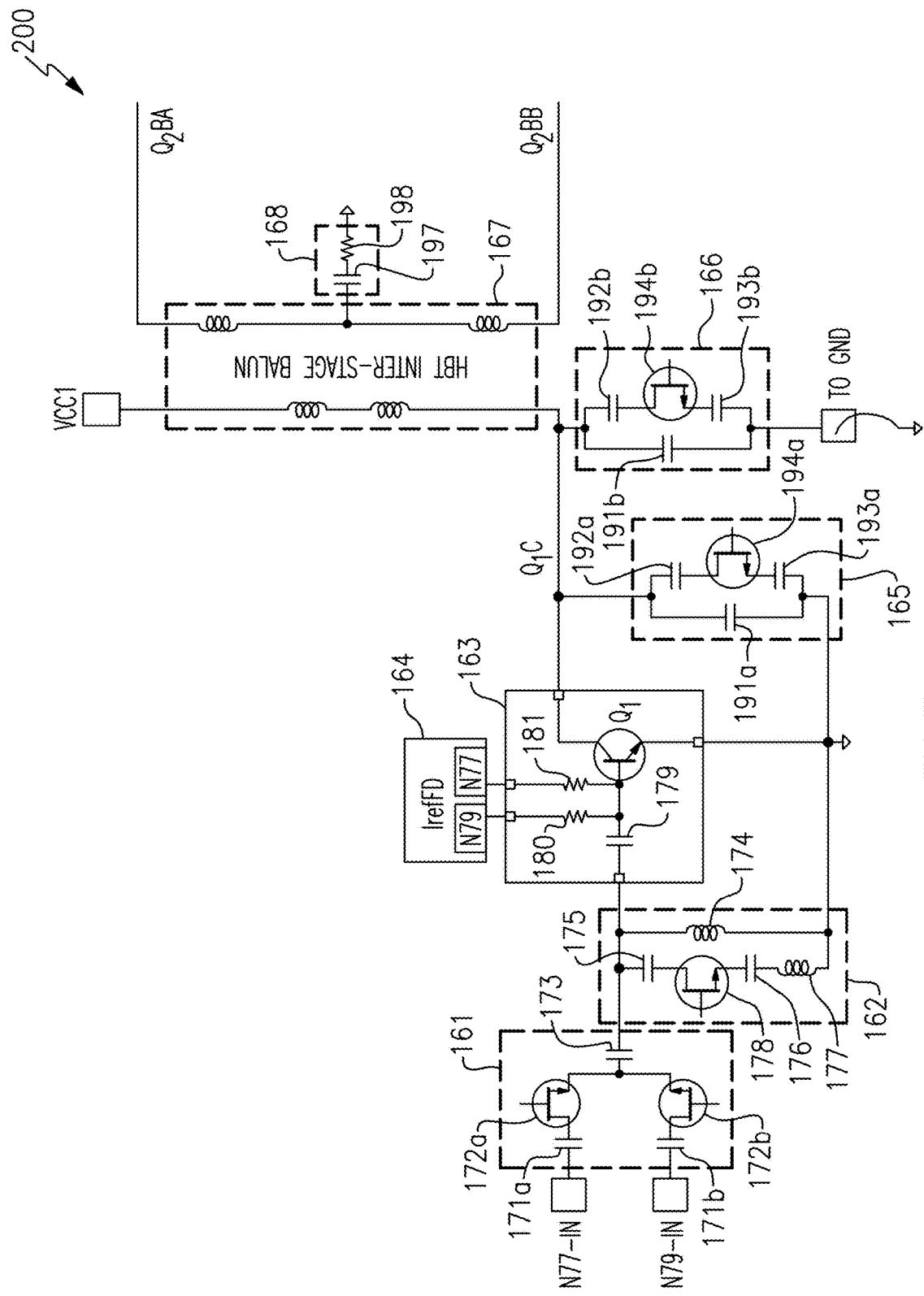
FIG. 7 is a schematic diagram of a portion of a reconfigurable power amplifier according to another embodiment.

FIG. 7 is a schematic diagram of a portion of a reconfigurable power amplifier according to another embodiment. The reconfigurable power amplifier circuitry 200 of FIG. 7 includes an input selection circuit 161, a controllable input matching circuit 162, a controllable driver amplifier 163, a driver biasing circuit 164, a first controllable output matching circuit 165, a second controllable output matching circuit 166, an input balun 167, and an input balun termination circuit 168.

In the illustrated embodiment, the input selection circuit 161 includes a first DC blocking capacitor 171a, a second DC blocking capacitor 171b, a first signal selection switch 172a, a second signal selection switch 172b, and a third DC blocking capacitor 173. The first signal selection switch 172a can be selected to choose a first RF input signal (for example, N77 received from node N77-IN), while the second signal selection switch 172b can be selected to choose a second RF input signal (for example, N79 received from node N79-IN).

The controllable input matching circuit 162 includes a fixed matching inductor 174, a first selectable matching capacitor 175, a second selectable matching capacitor 176, a selectable matching inductor 177, and a selection switch 178. Based on the selected operating frequency, the selection switch 178 can be opened or closed to change an input matching characteristic to the controllable driver amplifier 163.

As shown in FIG. 7, the controllable driver amplifier 163 includes an input capacitor 179, a first biasing resistor 180, a second biasing resistor 181, and a common emitter transistor $Q_1$. Based on the selected operating frequency, the driver biasing circuit 164 can bias the base of the common emitter transistor $Q_1$ with a first bias current provided through the first biasing resistor 180 or with a second bias current provided through the second biasing resistor 181.

With continuing reference to FIG. 7, the first controllable output matching circuit 165 includes a fixed capacitor 191a, a first selectable capacitor 192a, a second selectable capacitor 193a, and a selection switch 194a. Additionally, the second controllable output matching circuit 166 includes a fixed capacitor 191b, a first selectable capacitor 192b, a second selectable capacitor 193b, and a selection switch 194b. Based on the operating frequency, the selection switches 193a and 193b can be opened or closed to achieve desired output matching characteristics for the operating frequency band.

An amplified output signal from the controllable driver amplifier 163 is provided to one end of a primary side of the input balun 167 at a node $Q_1C$. The other end of the primary side of the input balun 167 receives a power supply voltage VCC1, which is used to supply power to the collector of the common emitter transistor $Q_1$. Thus, the first side of the input balun 167 also serves as a choke inductor for providing the power supply voltage VCC1 to the controllable driver amplifier 163. The secondary side of the input balun 167 generates a differential signal between nodes $Q_2BA$ and $Q_2BB$. A center tap of the secondary side of the input balun 167 is coupled to the input balun termination circuit 168, which includes a series capacitor 197 and a series resistor 198 connected in series between the center tap and ground, in this example.

FIG. 8A is a schematic diagram of one embodiment of a controllable output capacitor 210. The controllable output capacitor 210 includes a fixed capacitor 152, a first selectable output capacitor 151a, a second selectable output capacitor 151b, and a selection structure 154 including a first series switch 155a and a second series switch 155b. The selection structure 154 is controlled by a band control signal based on which frequency band is being amplified by a reconfigurable push-pull amplifier that includes transistors $Q_{2A}$ and $Q_{2B}$.

As shown in FIG. 8A, the controllable output capacitor 210 is coupled across the collectors of the transistors $Q_{2A}$ and $Q_{2B}$. In particular, the fixed capacitor 152 is connected between the collector of the transistor $Q_{2A}$ and the collector of the transistor $Q_{2B}$. Additionally, the first selectable capacitor 151a, the first switch 155a, the second switch 155b, and the second selectable capacitor 151b are connected in series between the collector of the transistor $Q_{2A}$ and the collector of the transistor $Q_{2B}$. The fixed capacitor 152 is in parallel with the series combination of the first selectable capacitor 151a, the first switch 155a, the second switch 155b, and the second selectable capacitor 151b.

FIG. 8B is a schematic diagram of the controllable output capacitor 210 of FIG. 8A in a first mode of operation. In this configuration, the first switch 155a and the second switch 155b are opened such that the output capacitance is about that of the fixed capacitor 152.

FIG. 8C is a schematic diagram of the controllable output capacitor 210 of FIG. 8A in a second mode of operation. In this configuration, the first switch 155a and the second switch 155b are closed such that the output capacitance is increased by the series combination of the first selectable capacitor 151a and the second selectable capacitor 151b.

With reference to FIGS. 8A-8C, the controllable output capacitor 210 is used to control both the fundamental and third harmonic impedance ($Z_{PA-A}/Z_{PA-B}$) seen by the PA collectors across the frequency of operation. For broadband operating, the fixed capacitor 152 alone cannot provide a suitable impedance termination across wide bandwidth, for instance, 50% fractional bandwidth. Accordingly, the depicted switchable capacitor scheme can be used to accommodate wide bandwidth performance.

During a high frequency mode (for instance, N79 transmit mode), the switchable capacitor operates with lower capacitance as shown in FIG. 8B. However, during a low frequency mode (for instance, N77 transmit mode), the switchable capacitor is active to support lower frequency operation (in which a larger output capacitor across the collectors is desired).

Since the voltage difference between the collector of the transistor $Q_{2A}$ and collector of the transistor $Q_{2B}$ can be a large voltage swing, an appropriate number of transistor switches can be stacked to ensure voltage swings across each of the switches remain below maximum breakdown voltages. Accordingly, transistor reliability can be maintained.

FIG. 8D is a schematic diagram of another embodiment of a controllable output capacitor 220. The controllable output capacitor 220 of FIG. 8D is similar to the controllable output capacitor 210 of FIG. 8A, except that the controllable output capacitor 220 further includes a first parallel capacitor 152a in parallel with the first switch 155a and a second parallel capacitor 152b in parallel with the second switch 155b.

By including a capacitor in parallel with each switch, voltage swing across the switches under different output voltage standing wave ratio (VSWR) conditions is substantially fixed by the capacitor ratio. Moreover, impact of the ON resistance of the switches on power amplifier performance is small, since only a small capacitor value can be switched. In one example, peak power amplifier efficiency (PAE) is degraded by 1% but 50% fractional bandwidth operation is enabled.

Figure 9C:
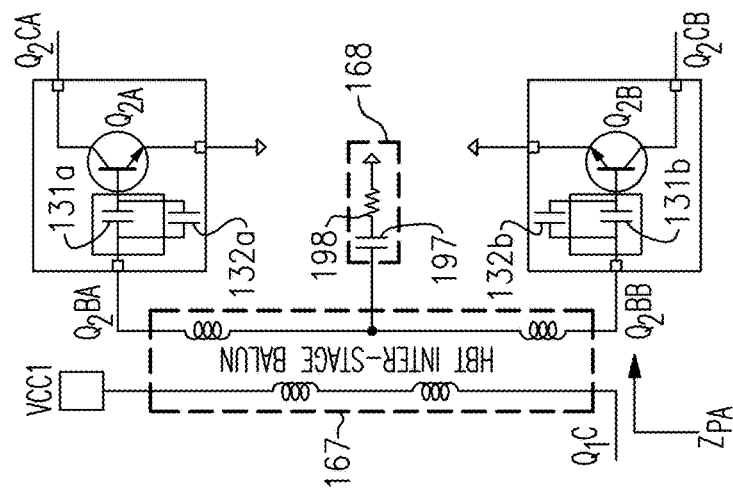
FIG. 9C is a schematic diagram of the controllable input capacitors of FIG. 9A in a second mode of operation.
Figure 9B:
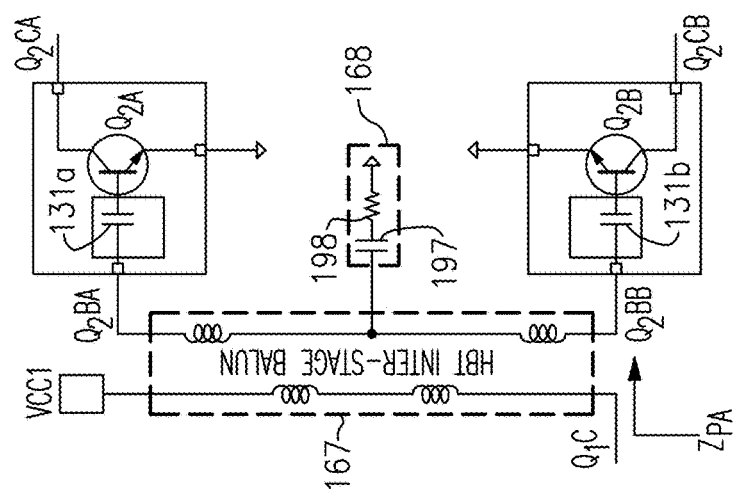
FIG. 9B is a schematic diagram of the controllable input capacitors of FIG. 9A in a first mode of operation.
Figure 9A:
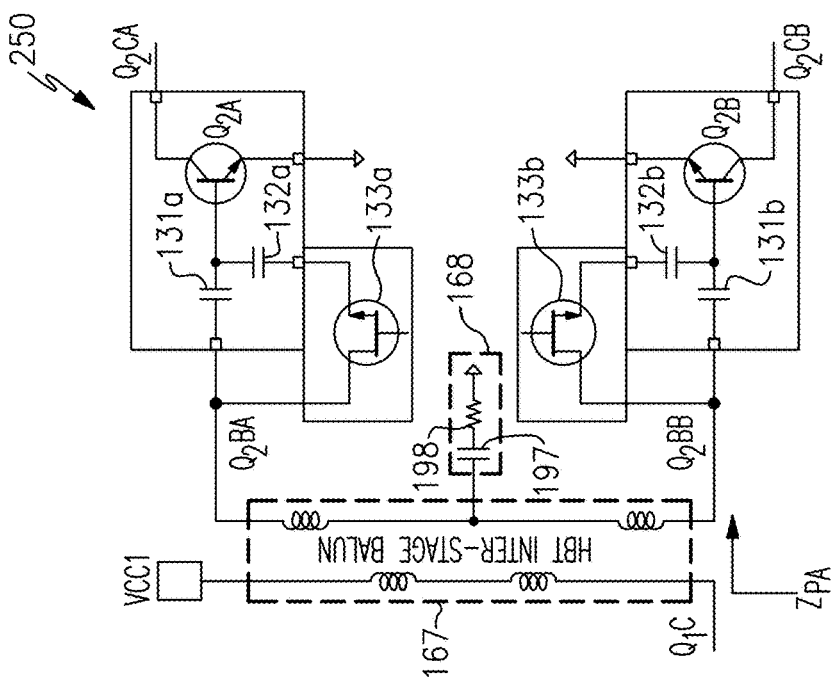
FIG. 9A is a schematic diagram of one embodiment of controllable input capacitors.

FIG. 9A is a schematic diagram of one embodiment of controllable input capacitors 250. In the illustrated embodiment, an input balun 167, a balun termination circuit 168 (including a series capacitor 197 and a series resistor 198), a first output amplifier transistor $Q_{2A}$, and a second output amplifier transistor $Q_{2B}$ are depicted. Additionally, the controllable input capacitors 250 include a first fixed capacitor 131a, a first selectable capacitor 132a, a first selection switch 133a, a second fixed capacitor 131b, a second selectable capacitor 132b, and a second selection switch 133b. The first selection switch 133a and the second selection switch 133b are controlled by a band control signal based on which frequency band is being amplified.

FIG. 9B is a schematic diagram of the controllable input capacitors 250 of FIG. 9A in a first mode of operation. In this example, the first selection switch 133a is opened such that the base input capacitance of transistor $Q_{2A}$ is about that of the first fixed capacitor 131a. Likewise, the second selection switch 133b is opened such that the base input capacitance of transistor $Q_{2B}$ is about that of the second fixed capacitor 131b.

FIG. 9C is a schematic diagram of the controllable input capacitors 250 of FIG. 9A in a second mode of operation. In this example, the first selection switch 133a is closed such that the base input capacitance of transistor $Q_{2A}$ is increased by the first selectable capacitor 132a. Likewise, the second selection switch 133b is closed such that the base input capacitance of transistor $Q_{2B}$ is increased by the second selectable capacitor 132b.

With reference to FIGS. 9A-9C, in a two-stage differential push-pull power amplifier design, the input balun (for example, input balun 167) between a driver amplifier and a pair of output amplifiers serve to convert the single ended output of driver amplifier into a balanced signal for the pair of output amplifiers. The input impedance of the pair of output amplifiers sets the collector impedance of the driver amplifier.

To ensure wide bandwidth operation in such an architecture, the collector impedance of the driver amplifier should be properly controlled across large bandwidth such that the driver amplifier drives the pair of output amplifiers into saturation. For this purpose, a switchable segmented capacitor scheme as shown in FIGS. 9A-9C can be included. During a high frequency mode (for instance, a N79 transmit mode) the additional input capacitors are turned off, and the input balun 167 and pair of output amplifiers support high frequency operation. However, during low frequency operation (for instance, an N77 transmit mode), additional input capacitance is provided to reduce input impedance to the pair of output amplifiers. Thus, desired impedance across both low and high frequencies is provided.

Figure 10C:
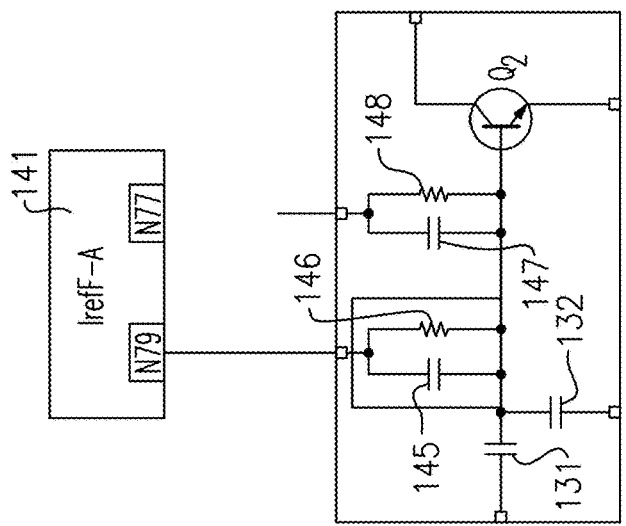
FIG. 10C is a schematic diagram of the controllable ballasting network of FIG. 10A in a second mode of operation.
Figure 10B:
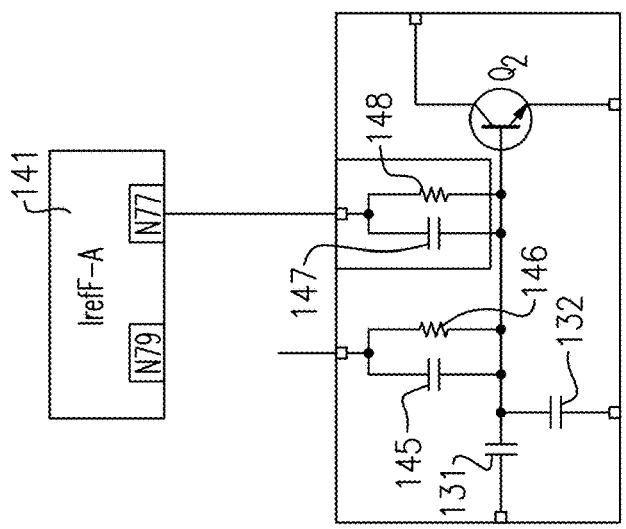
FIG. 10B is a schematic diagram of the controllable ballasting network of FIG. 10A in a first mode of operation.
Figure 10A:
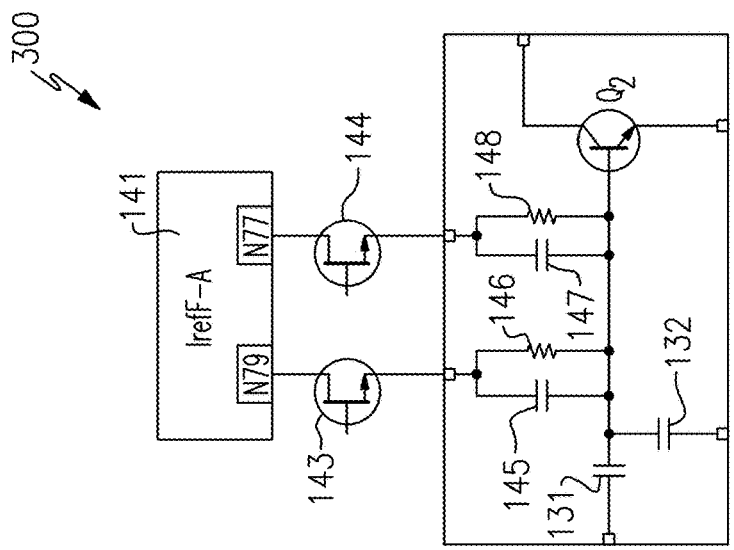
FIG. 10A is a schematic diagram of one embodiment of a controllable ballasting network.

FIG. 10A is a schematic diagram of one embodiment of a controllable ballasting network 300. In the illustrated embodiment, a biasing current circuit 141, a fixed input capacitor 131, a selectable input capacitor 132, and a transistor $Q_2$ are depicted. Additionally, the controllable ballasting network 300 includes a first selection switch 143, a second selection switch 144, a first ballasting capacitor 145, a first ballasting resistor 146, a second ballasting capacitor 147, and a second ballasting resistor 148. The first selection switch 143 and the second selection switch 144 are controlled by a band control signal based on which frequency band is being amplified.

The depicted ballasting circuitry is shown for one output amplifier of a pair of output amplifiers. However, the ballasting circuitry can be replicated for each output amplifier.

FIG. 10B is a schematic diagram of the controllable ballasting network 300 of FIG. 10A in a first mode of operation. In this example, the first selection switch 143 is opened and the second selection switch 144 is closed such that base of the transistor $Q_2$ is biased by a second bias current from the biasing current circuit 141 through the second ballasting capacitor 147 and the second ballasting resistor 148.

FIG. 10C is a schematic diagram of the controllable ballasting network 300 of FIG. 10A in a second mode of operation. In this example, the first selection switch 143 is closed and the second selection switch 144 is opened such that base of the transistor $Q_2$ is biased by a first bias current from the biasing current circuit 141 through the first ballasting capacitor 145 and the first ballasting resistor 146.

With reference to FIGS. 10A-10C, to support large bandwidth (for instance, 5G modulation), a selectable RC ballasting scheme is used to achieve flat AM/AM and AM/PM profile in a reconfigurable differential push-pull amplifier. The resistance value can be chosen based on a ruggedness specification, while the capacitance value can be chosen based on the frequency of operation. To support flat AM/AM and flat AM/PM for broadband operation in the reconfigurable power amplifier architecture, a switchable RC ballasting scheme as shown in FIGS. 10A-10C can be used. For low frequency operation (for instance, N77), a larger capacitance is provided by way of selecting the second ballasting capacitor 147. For higher frequency operation (for instance, N79), a smaller capacitance value is provided by way of selecting the first ballasting capacitor 145. Thus, a flat AM/PM profile is achieved for both frequency bands without degrading ruggedness criteria.

Figure 11:
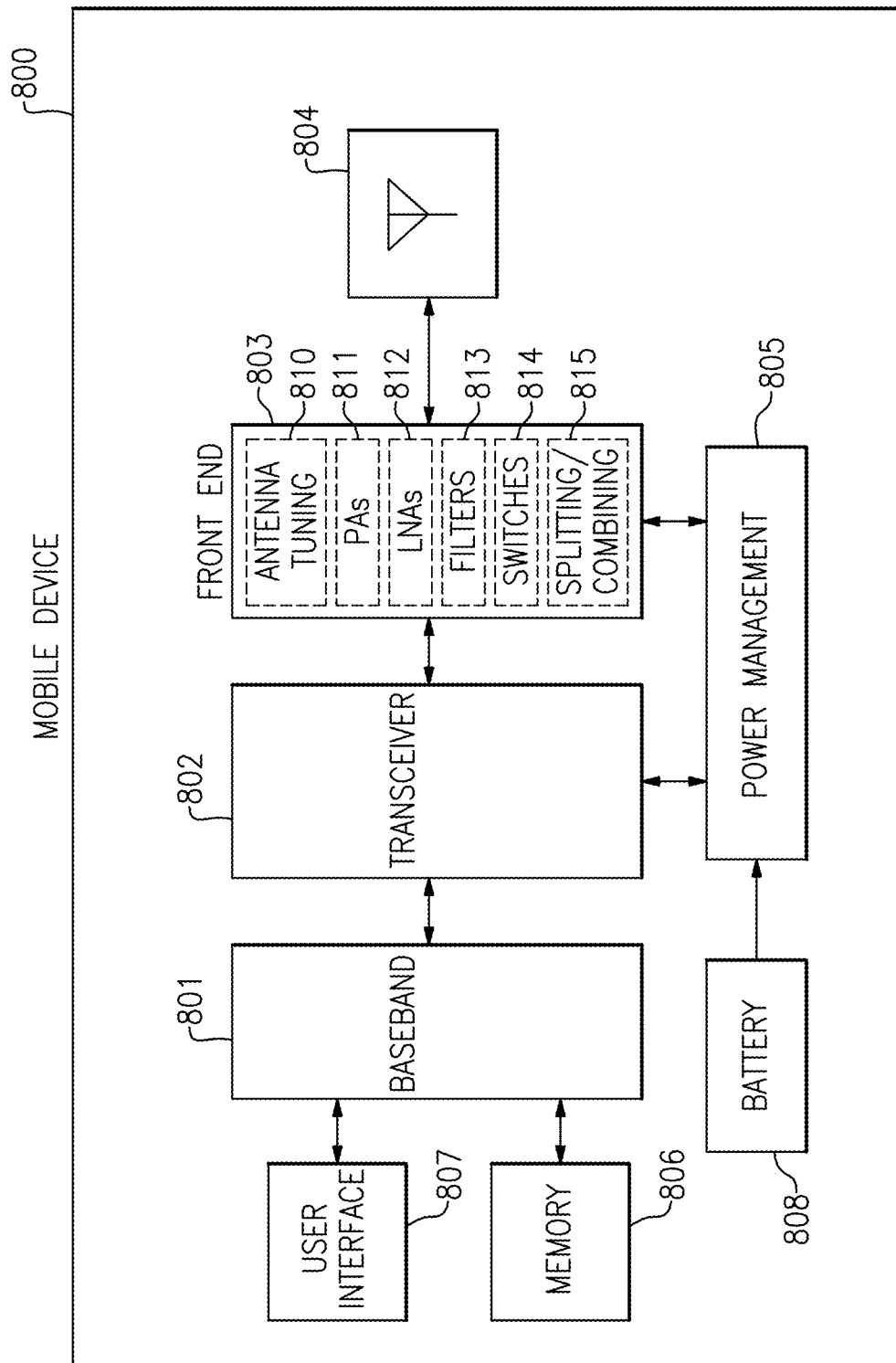
FIG. 11 is a schematic diagram of one embodiment of a mobile device.

FIG. 11 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 11 as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

The power amplifiers 811 can include one or more reconfigurable power amplifiers implemented in accordance with the teachings herein.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front-end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 11, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 11, the power management system 805 receives a battery voltage from the battery 808. The battery 808 can be any suitable battery for use in the mobile device 800, including, for example, a lithium-ion battery.

Figure 12:
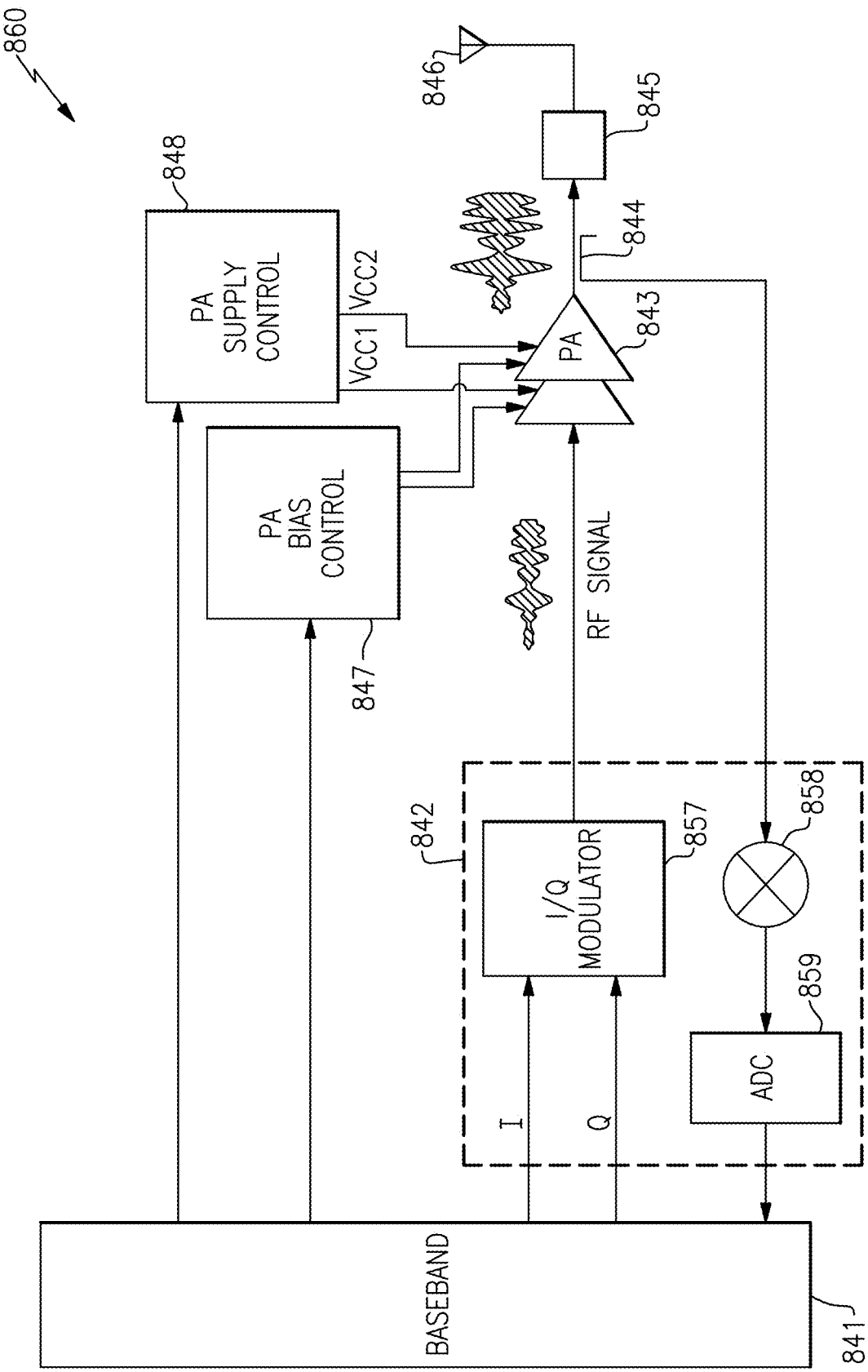
FIG. 12 is a schematic diagram of a power amplifier system according to one embodiment.

FIG. 12 is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 12, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

The power amplifier 843 can be implemented as a reconfigurable power amplifier in accordance with any of the embodiments herein.

Applications

Some of the embodiments described above have provided examples in connection with mobile devices. However, the principles and advantages of the embodiments can be used for any other systems or apparatus that have needs for reconfigurable power amplifiers. Examples of such systems or apparatus include, but are not limited to, mobile phones, tablets, base stations, network access points, customer-premises equipment (CPE), laptops, and wearable electronics.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
   a transceiver configured to generate a first radio frequency signal of a first frequency band and a second radio frequency signal of a second frequency band; and
   a front-end system including a push-pull power amplifier configured to selectively amplify one of the first radio frequency signal or the second radio frequency signal based on a band control signal, the push-pull power amplifier including an input balun, an output balun, and a pair of amplifiers coupled between the input balun and the output balun, the band control signal operable to control an input capacitance of the pair of amplifiers.

2. The mobile device of claim 1 wherein the pair of amplifiers includes a first amplifier having a first controllable input capacitor and a second amplifier having a second controllable input capacitor, a capacitance of the first controllable input capacitor and a capacitance of the second controllable input capacitor controlled by the band control signal.

3. The mobile device of claim 2 wherein the first controllable input capacitor includes a first fixed input capacitor in parallel with a series combination of a first selectable input capacitor and a first switch.

4. The mobile device of claim 2 wherein the first amplifier includes a first bipolar transistor and the input balun includes a primary side and a secondary side, the first controllable input capacitor electrically connected in series between one end of the secondary side of the input balun and a base of the first bipolar transistor.

5. The mobile device of claim 1 wherein the push-pull power amplifier further including a driver amplifier configured to drive a primary side of the input balun, the pair of amplifiers coupled to a secondary side of the input balun.

6. The mobile device of claim 5 wherein the band control signal is operable to control the input capacitance of the pair of amplifiers to change an impedance presented to the driver amplifier.

7. The mobile device of claim 5 wherein the push-pull power amplifier further includes a signal selection circuit coupled to an input of the driver amplifier and configured to receive the first radio frequency signal, the second radio frequency signal, and the band control signal.

8. The mobile device of claim 1 wherein the first frequency band is fifth generation N77 and the second frequency band is fifth generation N79.

9. The mobile device of claim 1 wherein the pair of amplifiers each further include an amplification transistor and a controllable ballasting network coupled to an input of the amplification transistor, the controllable ballasting network including at least one of a capacitance or a resistance that changes based on the band control signal.

10. The mobile device of claim 1 wherein the push-pull power amplifier further includes a controllable output capacitor coupled across a pair of outputs of the pair of amplifiers, the controllable output capacitor having a capacitance that changes based on the band control signal.

11. A method of amplification in a mobile device, the method comprising:
    generating a first radio frequency signal of a first frequency band and a second radio frequency signal of a second frequency band using a transceiver;
    selecting one of the first radio frequency signal or the second radio frequency signal as a selected radio frequency signal based on a band control signal;
    amplifying the selected radio frequency signal using a push-pull power amplifier that includes an input balun, an output balun, and a pair of amplifiers coupled between the input balun and the output balun; and
    controlling an input capacitance of the pair of amplifiers based on the band control signal.

12. The method of claim 11 wherein the pair of amplifiers each further include an amplification transistor and a controllable ballasting network coupled to an input of the amplification transistor, the method further comprising controlling at least one of a capacitance or a resistance of the controllable ballasting network based on the band control signal.

13. The method of claim 11 further comprising controlling a capacitance of a controllable output capacitor coupled across a pair of outputs of the pair of amplifiers based on the band control signal.

14. A push-pull power amplifier comprising:
    an input selection circuit configured to provide a selected radio frequency signal based on a band control signal, the selected radio frequency signal chosen from one of a first radio frequency signal of a first frequency band or a second radio frequency signal of a second frequency band;
    an input balun;
    an output balun; and
    a pair of amplifiers coupled between the input balun and the output balun and operable to amplify the selected radio frequency signal, the band control signal operable to control an input capacitance of the pair of amplifiers.

15. The push-pull power amplifier of claim 14 wherein the pair of amplifiers includes a first amplifier having a first controllable input capacitor and a second amplifier having a second controllable input capacitor, a capacitance of the first controllable input capacitor and a capacitance of the second controllable input capacitor controlled by the band control signal.

16. The push-pull power amplifier of claim 15 wherein the first controllable input capacitor includes a first fixed input capacitor in parallel with a series combination of a first selectable input capacitor and a first switch.

17. The push-pull power amplifier of claim 15 wherein the first amplifier includes a first bipolar transistor and the input balun includes a primary side and a secondary side, the first controllable input capacitor electrically connected in series between one end of the secondary side of the input balun and a base of the first bipolar transistor.

18. The push-pull power amplifier of claim 14 further comprising a driver amplifier coupled between the input selection circuit and the input balun, the band control signal operable to control the input capacitance of the pair of amplifiers to change an impedance presented to the driver amplifier.

19. The push-pull power amplifier of claim 14 wherein the pair of amplifiers each further include an amplification transistor and a controllable ballasting network coupled to an input of the amplification transistor, the controllable ballasting network including at least one of a capacitance or a resistance that changes based on the band control signal.

20. The push-pull power amplifier of claim 14 further comprising a controllable output capacitor coupled across a pair of outputs of the pair of amplifiers, the controllable output capacitor having a capacitance that changes based on the band control signal.

\* \* \* \* \*